(12) United States Patent
Bhat et al.

(10) Patent No.: US 6,933,539 B1
(45) Date of Patent: Aug. 23, 2005

(54) TUNNEL JUNCTIONS FOR LONG-WAVELENGTH VCSELS

(75) Inventors: Rajaram Bhat, Painted Post, NY (US); Nobuhiko Nishiyama, Painted Post, NY (US)

(73) Assignee: Corning Incorporated, Corning, NY (US)

( * ) Notice: Subject to any disclaimer, the term of this patent is extended or adjusted under 35 U.S.C. 154(b) by 0 days.

(21) Appl. No.: 10/848,456

(22) Filed: May 17, 2004

(51) Int. Cl.$^7$ .................. H01L 29/861; H01L 29/88
(52) U.S. Cl. .................................................. 257/104
(58) Field of Search .................. 257/25, 104; 438/22, 438/979; 372/46, 96

(56) References Cited

U.S. PATENT DOCUMENTS

| 6,765,238 B2 * | 7/2004 | Chang et al. ............... 257/104 |
| 2004/0051113 A1 | 3/2004 | Chang et al. ............... 257/104 |

FOREIGN PATENT DOCUMENTS

| EP | 0715357 A1 | 6/1996 |
| EP | 1401069 A2 | 3/2004 |
| WO | WO03/073565 A2 | 9/2003 |

OTHER PUBLICATIONS

*Introduction to Semiconductor Integrated Optics*, Hans P. Zappe 1995 Artech House Inc. Chapter 3, pp. 60-61 and 198-199.

7$^{th}$ biennial workshop on *Organometallic Vapor Phase Epitaxy*, Apr. 2-6, 1995.
"InP/GaAsSb/InP and InP/GaAsSb/InGaAsP double heterojunction bipolar transistors with a carbon-doped base grown by organometallic chemical vapor desposition", R. Bhat, Appl. Phys. Letters 68 (7) Feb. 12, 1996 pp. 985-987.
"Theory of band tails in heavily doped semiconductors", Piet Van Mieghem, Rev. Mod. Phys. 64, 755-793.
"High efficiency long wavelength VCSELS on InP grown by MOCVD", N. Nishiyama, Electronics Letters Mar. 6, 2003 vol. 39, No. 5.
*Optical Processes In Semiconductors*, J. Pankove, Prentice Hall, Inc. 1971 pps. 10-12, and 39-46.
"Long-wavelength VCSELs on InP grown by MOCVD", N. Nishiyama, et al, Proceedings of SPIE vol. 5246, Aug. 2003, pp. 10-17.

* cited by examiner

*Primary Examiner*—Thien F Tran
(74) *Attorney, Agent, or Firm*—Juliana Agon (57) ABSTRACT

A tunnel junction device (102) with minimal hydrogen passivation of acceptors includes a p-type tunnel junction layer (106) of a first semiconductor material doped with carbon. The first semiconductor material includes aluminum, gallium, arsenic and antimony. An n-type tunnel junction layer (104) of a second semiconductor material includes indium, gallium, arsenic and one of aluminum and phosphorous. The junction between the p-type and an-type tunnel junction layers forms a tunnel junction (110).

13 Claims, 4 Drawing Sheets

United States Patent US 6,933,539 B1

TUNNEL JUNCTIONS FOR LONG-WAVELENGTH VCSELS

BACKGROUND OF THE INVENTION

1. Field of the Invention

The present invention relates generally to surface emitting lasers, and particularly to tunnel junctions for long-wavelength vertical cavity surface emitting lasers (VCSELs).

2. Technical Background

Vertical cavity surface emitting lasers (VCSELs) have become an important component in data communication systems. Currently commercial lasers operate at 850 nm, where the lasers are made using AlAsGaAs/GaAs semiconductor layers on GaAs substrates. In these lasers the mirrors forming the optical cavity are formed using alternating layers of AlAs and GaAs, with the AlAs/AlGaAs mirror on at least one side of the active region. Adjacent to the active region is an n-type spacer layer, on one side, and a p-type spacer layer, on the other, which inject carriers into the active region when a voltage is applied to the laser. One of the approaches to achieving VCSELs lasing at the important telecommunication wavelengths of 1.3 or 1.55 microns is to fabricate the lasers from materials based on InP substrates.

One problem with this approach is the high free carrier absorption in the p-doped layers of the laser. Free-carrier absorption is the phenomenon whereby an electron or hole within a band absorbs radiation by transferring from a low-energy level to an empty high-energy level. This problem becomes worse as the lasing wavelength increases to the longer wavelengths of 1.3 or 1.55 microns. However, free-carrier absorption is not as significant a problem for short wavelength VCSELs, such as 850 nm VCSELs.

To make matters worse, the poor mobility of the p-type layers results in a non-uniform current injection. Therefore, thick p-type layers may be needed to make uniform current injection. The increased thickness of the p-type layers increases the total optical absorption by the free carrier absorption.

These long-wavelength VSCEL problems can be addressed by using a tunnel junction to replace most of the p-doped layers with n-doped layers, as has been done recently by several groups. Because n-doped layers have a lower free carrier absorption and a higher mobility of carriers than p-doped layers, total optical absorption can be reduced by the replacement of the p-doped layer with a tunnel junction as well as obtaining a uniform current injection. Tunnel junctions or Esaki junctions are well known and can be used, aside from long-wavelength VCSELs, in many other applications, such as solar cells.

Conventional VCSELs without tunnel junctions have one p-n junction which forms the active layers. Carrier injection is the process whereby carriers are injected across a p-n junction, with electrons being injected from the n-layer into the p-layer and holes from the p-layer into the n-layer when an external electric source is applied to the junction.

On the other hand, VCSELs with tunnel junctions require n-p-n junctions. Firstly, the n-p junction is a tunnel junction which has heavily doped n-type and p-type layers. Secondly, the p-n junction is formed by the active layers in the same manner as in conventional VCSELs. When an electrical bias is applied in a forward direction to the p-n junction of the active layers, the same electrical bias appears as a reverse bias for the tunnel junction. As a result, the reverse biased tunnel junction, used in the VCSEL, converts the hole current in the p-doped layers to an electron current in the n-doped layers.

In order to make as near ideal a tunnel junction as possible and to minimize the series resistance of a VCSEL, it is necessary to obtain very high n- and p-doping in the layers forming the tunnel junction.

It is also known that low optical absorption is desired in tunnel junctions for VCSELs. If the optical absorption is low in a VCSEL, the threshold current decreases while the slope efficiency increases. With the increase of slope efficiency, maximum output power of the VCSEL increases.

The optical absorption of the VCSEL consists of optical absorption, scattering loss and others. The optical absorption consists of the free carrier absorption and the bandgap absorption. When the photon energy of wavelength is greater than the bandgap energy, the bandgap absorption, which is typically >4000 cm$^{-1}$ is dominant compared with the free carrier absorption which ranges about <100 cm$^{-1}$.

The active layer or region is the layer or region in a semiconductor injection laser or light-emitting diode that provides optical gain. The active region is not really a single layer but multiple layers, each of which can have their own lattice constant. Typically, the active region consists of a multiple quantum wells with compressively strained quantum well layers and often tensile strained barrier layers. The tunnel junction converts incoming electrons into holes that are injected into the active region. Electrons are injected into the active region from the n-side of the active region and holes from the p-side. The recombination of electrons and holes in the active region produces photons, which enable the laser operation.

There can be as many lattice constants as there are layers and these can all be different. One usually tries to keep them the same (lattice matched to the substrate) but sometimes one changes them to introduce strain for added design flexibility. For example, the active region quantum wells are intentionally strained to obtain certain benefits, such as lower threshold and higher gain in lasers. However, the thickness of the strained layer is limited because it creates crystal defects beyond a certain thickness level, resulting in poor performance of devices and poor reliability. Therefore, strained layers should not be used unless it is really needed, as in the active region quantum wells. Feedback resonators, enclosing the spacer layers, to form the optical cavity, are commonly used in VCSELs to obtain lasing.

One technical challenge is that a high probability of tunneling is required in tunnel junctions. Tunneling is an observed effect of the ability of certain atomic particles to pass through a barrier that they cannot pass over because of the required energy, based on a law of quantum mechanics that predicts that the particles have a finite probability for tunneling according to their quantum-mechanical nature. If the tunneling probability increases, the electrical resistance decreases. With the reduction of the electrical resistance, joule heat inside the device decreases. With the reduction of heat, both the maximum output power and temperature performance of the overall device increase.

To increase the tunneling probability, one important way is to ensure that the doping levels of each n-type and p-type layer forming the tunnel junction should be as high as possible. At the same time, a low diffusivity dopant is needed for doping the tunnel junction.

Position control is the reason why a low diffusivity dopant is needed. Typically, the tunnel junction is located at the node of the standing wave of the optical field in the optical cavity. Because optical absorption is proportional to the intensity of optical field, at the node of the standing wave, the absorption is less. Therefore, if the tunnel junction is matched to the position of the node, absorption is less. A low diffusivity dopant is necessary in order to be able to define the position of a tunnel junction. However, if the dopant diffuses everywhere, the tunnel junction no longer coincides with the node of the standing wave and optical absorption increases.

Obtaining a very high p-doping while avoiding diffusion, entails using carbon (C) as the p-dopant, since carbon has a very low diffusion coefficient. Unfortunately, in many materials grown by organometallic chemical vapor deposition (OMCVD), a significant fraction of the carbon acceptors are compensated by hydrogen (H) atoms preventing a high hole concentration. Although this problem can be avoided by growing the materials by molecular beam epitaxy (MBE), the preferred method for high volume manufacture is OMCVD. Therefore, obtaining high p-type doping by OMCVD, the preferred high volume growth technology, has been difficult due to the passivation of acceptors by hydrogen.

It is also known that another way to increase the probability of tunneling is for tunnel junctions to maintain a desirable small difference between the valence band energy ($E_v$) of the material of the p-type tunnel junction layer and the conduction band energy ($E_c$) of the material of the n-type tunnel junction layer. To achieve this, it is known that the bandgaps of the materials forming the tunnel junction should be minimized. However, if the bandgap of each individual tunnel junction layer is too low for the lasing wavelength, optical absorption by the bandgap increases. Long-term problems in long-wavelength-VCSELs research remain on how to formulate the optimum compositions of the materials of the tunnel junction layers to meet these criteria and to minimize light absorption in the context of other technical and manufacturing challenges.

Other unknown properties, in particular implementations, include difficulties of doping alternative materials such as AlGaInAs with high p-levels using carbon (C) while minimizing hydrogen (H) passivation. Recently it has been shown that the problem of the passivation by hydrogen is nearly non-existent in C-doped GaAsSb. However, other technical and manufacturing challenges still have to be met. We have found the bandgap of GaAsSb to be too low for use even in 1.55 micron long wavelength VCSELs. We believe that even tensile strained GaAsSb may have too low a bandgap to be suitable for long-wavelength VCSELS, such as at 1.3 micron, due to the bandtails formed in heavily p-doped semiconductors giving rise to excessive absorption at energies below the intrinsic bandgap. In addition to the low bandgap problem, strained layers should still be avoided.

In some approaches of carbon-doped tunnel junctions in long-wavelength VCSELs of some specific material systems such as GaAsSb, the strain and bandgap are interconnected. When the bandgap is not independent of the strain, there is no flexibility to overcome undesired properties of the tunnel junction. Decoupling the strain from the bandgap is well known in some semiconductor devices. However the need or the implementation of decoupling in certain material systems and specific device implementation is not known. In order to decouple, the optimum bandgap value needs to be predetermined so that fabrication resources and time are not wasted.

AlGaAsSb can have a larger bandgap than the lasing wavelength of 1.3 or 1.55 microns. The bandgap of GaAsSb is too narrow and, as a result, it has large optical absorption or loss if GaAsSb is used as part of the tunnel junction. As can be seen in FIG. 4 of the Agilent patent application U.S. 2004/0051113, "InP" is used as a common substrate material at the right side vertical axis. To grow a layer on InP, the lattice constant of the layer has to be matched to the lattice constant of InP. For GaAsSb, about 0.5 fraction of Sb is matched to InP. But, in this case, the bandgap of GaAsSb is about 1.55 um which is not sufficient to prevent excessive absorption in a tunnel junction used in a VCSEL lasing at a wavelength of 1.55 or 1.31 um lasers.

An additional phenomenon needs to be considered, ahead of time, in pre-determining the optimum bandgap. Bandtails are known but their existence in tunnel junction layers used in VCSELs or other devices have not yet been taught. For example, heavy p-doping gives rise to bandtails, which results in absorption at energies lower than the intrinsic bandgap energy of the semiconductor. For p-type layer, we can define an effective bandgap, which is lower than the intrinsic bandgap, below which the absorption can be ignored. The extent of the bandtail and hence the effective bandgap will depend on the doping level Adequate separation has to be maintained between the photon energy of the lasing wavelength and the effective bandgap in order to minimize absorption in the p-layer. The same separation between the photon energy of the lasing wavelength and the intrinsic bandgap of the p-layer of the tunnel junction would give rise to too high an absorption of the laser light.

The detailed nature of how the p-doping and n-doping is used with the particular material systems in the tunnel junction of a long-wavelength VCSEL is a critical issue because the resulting structure must perform multiple functions which include providing a low series resistance, funneling of carriers into the active region, and minimizing the effects of free carrier absorption.

For p-type materials, the bandtails cause a reduction in the energy at which significant absorption takes place (effective bandgap is reduced). In n-type materials, the Moss-Burstein effect (due to band filling) causes a shift of the absorption to higher energy (effective bandgap is increased). Because of the large band filling in n-type materials, the bandtails do not play a role in reducing the effective band gap. For the n-type tunnel junction layer, one can use a material with a smaller intrinsic bandgap than would be the case if the Moss-Burstein shift was absent.

The Moss-Burstein effect can also be present in p-type materials but the band filling is minimal due to the larger mass of holes compared to electrons. Therefore, there is essentially no increase of the energy (which opposes the effect due to bandtailing) at which significant absorption takes place in p-type materials.

Another previously not accounted for effect is the observance that heavy doping causes bandtails to be formed and absorption occurs at lower energies than that of the intrinsic bandgap. These bandtails are not desirable features but something which cannot be avoided and the resultant increased absorption at the lasing wavelength has to be overcome by increasing the intrinsic bandgap of the p-type tunnel junction layer.

Therefore, a simple working tunnel junction that is compatible with a long wavelength VCSEL is desired that overcomes performance-limiting and manufacturing-limiting properties. The manufacturing criterion includes minimal hydrogen passivation of acceptors in an OMCVD reactor. Determining a pre-determined optimum bandgap value, for a decoupled strain and bandgap long-wavelength VCSEL tunnel junction layers that increases the probability of tunneling, without wasting fabrication resources and time is desirable.

SUMMARY OF THE INVENTION

The present invention teaches the use of C-doped AlGaAsSb as the p-type tunnel junction layer and demonstrated that the combination P++–AlGaAsSb/ N++–AlGaInAs makes an excellent tunnel junction. The introduction of Al allows us to decouple the strain from the bandgap in AlGaAsSb and allows additional freedom in the design of a tunnel junction. The introduction of Al also allows us to overcome the deleterious effect of bandtails formed in heavily p-doped semiconductors.

One aspect of the invention is a tunnel junction device with minimal hydrogen passivation of acceptors. The tunnel junction device includes a p-type tunnel junction layer of a first semiconductor material doped with carbon. The first semiconductor material includes aluminum (Al), gallium (Ga), arsenic (As) and antimony (Sb). An n-type tunnel junction layer of a second semiconductor material includes indium (In), gallium (Ga), arsenic (As) and one of aluminum (Al) and phosphorous (P). The junction between the p-type and the n-type tunnel junction layers forms a tunnel junction.

In another aspect, the present invention includes doping a first semiconductor material to form a p-type tunnel junction layer with a carbon concentration in a range from about $1.5 \times 10^{19}$ cm$^{-3}$ to $3 \times 10^{20}$ cm$^{-3}$.

Additional features and advantages of the invention will be set forth in the detailed description which follows, and in part will be readily apparent to those skilled in the art from that description or recognized by practicing the invention as described herein, including the detailed description which follows, the claims, as well as the appended drawings.

It is to be understood that both the foregoing general description and the following detailed description present embodiments of the invention, and are intended to provide an overview or framework for understanding the nature and character of the invention as it is claimed. The accompanying drawings are included to provide a further understanding of the invention, and are incorporated into and constitute a part of this specification. The drawings illustrate various embodiments of the invention, and together with the description serve to explain the principles and operations of the invention.

DETAILED DESCRIPTION OF THE PREFERRED EMBODIMENTS

Reference will now be made in detail to the present preferred embodiments of the invention, examples of which are illustrated in the accompanying drawings. Whenever possible, the same reference numerals will be used throughout the drawings to refer to the same or like parts. One embodiment of a semiconductor device of the present invention is shown in FIG. 1, and is designated generally throughout by the reference numeral 100.

Figure 1:
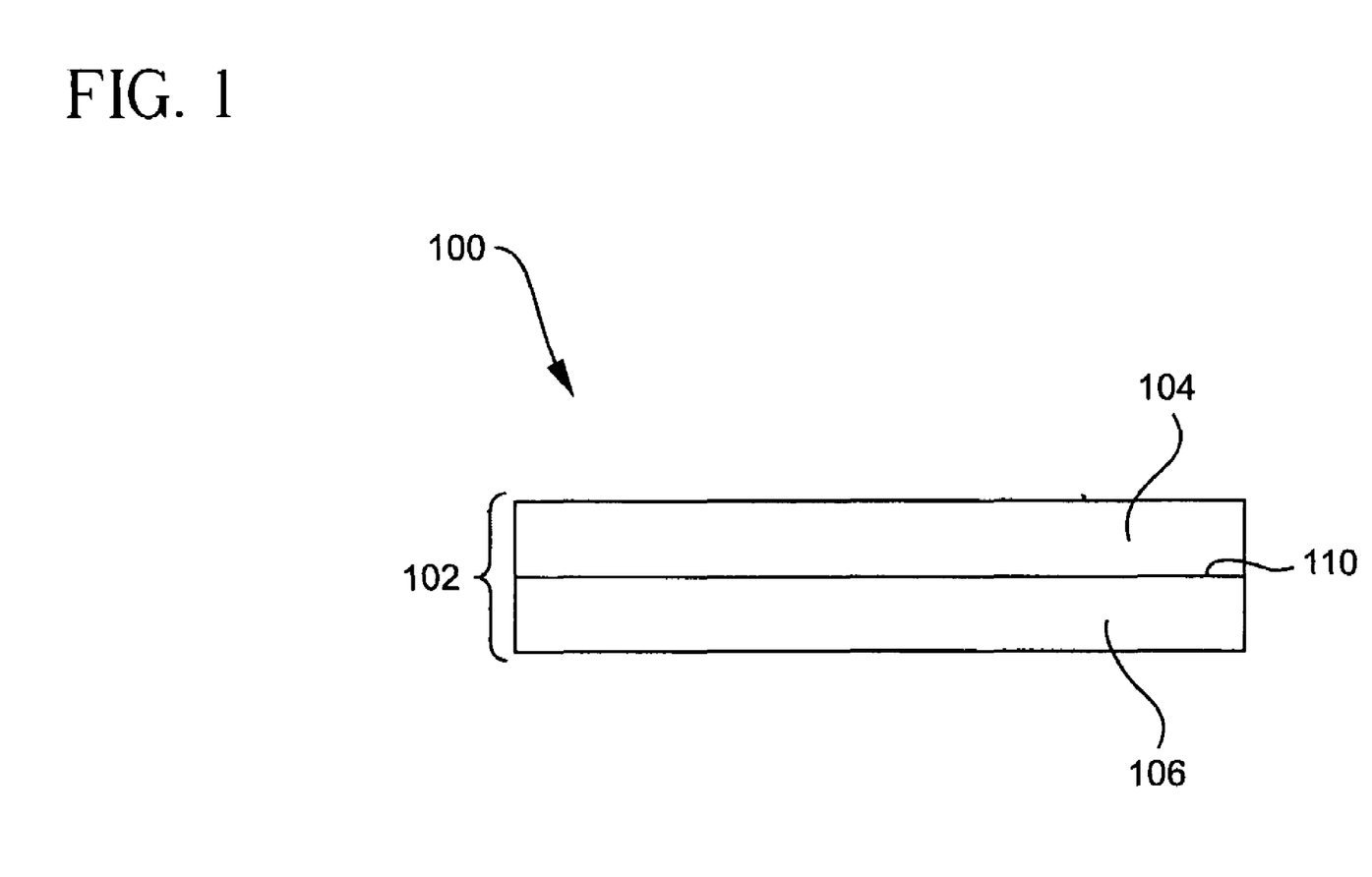
FIG. 1 is a schematic side view of a tunnel junction structure of one embodiment of the present invention.

Referring to FIG. 1, a tunnel junction device 102 with minimal hydrogen passivation of acceptors includes a p-type tunnel junction layer 106 of a first semiconductor material doped with carbon (C). As part of a new material systems combination, the first semiconductor material includes aluminum (Al), gallium (Ga), arsenic (As) and antimony (Sb). The present invention uses carbon doped AlGaAsSb as the p-material for the tunnel junction because hydrogen compensation of carbon acceptors is significantly less than in materials such as AlGaInAs, which has been previously used for forming the p-type tunnel junction layer.

Juxtaposed with the p-type tunnel junction layer 106, an n-type tunnel junction layer 104 of a second semiconductor material includes indium (In), gallium (Ga), arsenic (As) and one of aluminum (Al) and phosphorous (P). The junction between the p-type and an-type tunnel junction layers forms a tunnel junction 110.

At least one of the tunnel junction layers 104 or 106 has a thickness≦30 nm. Preferably, each of the tunnel junction layers 104 and 106 has a thickness≦30 nm.

Figure 2:
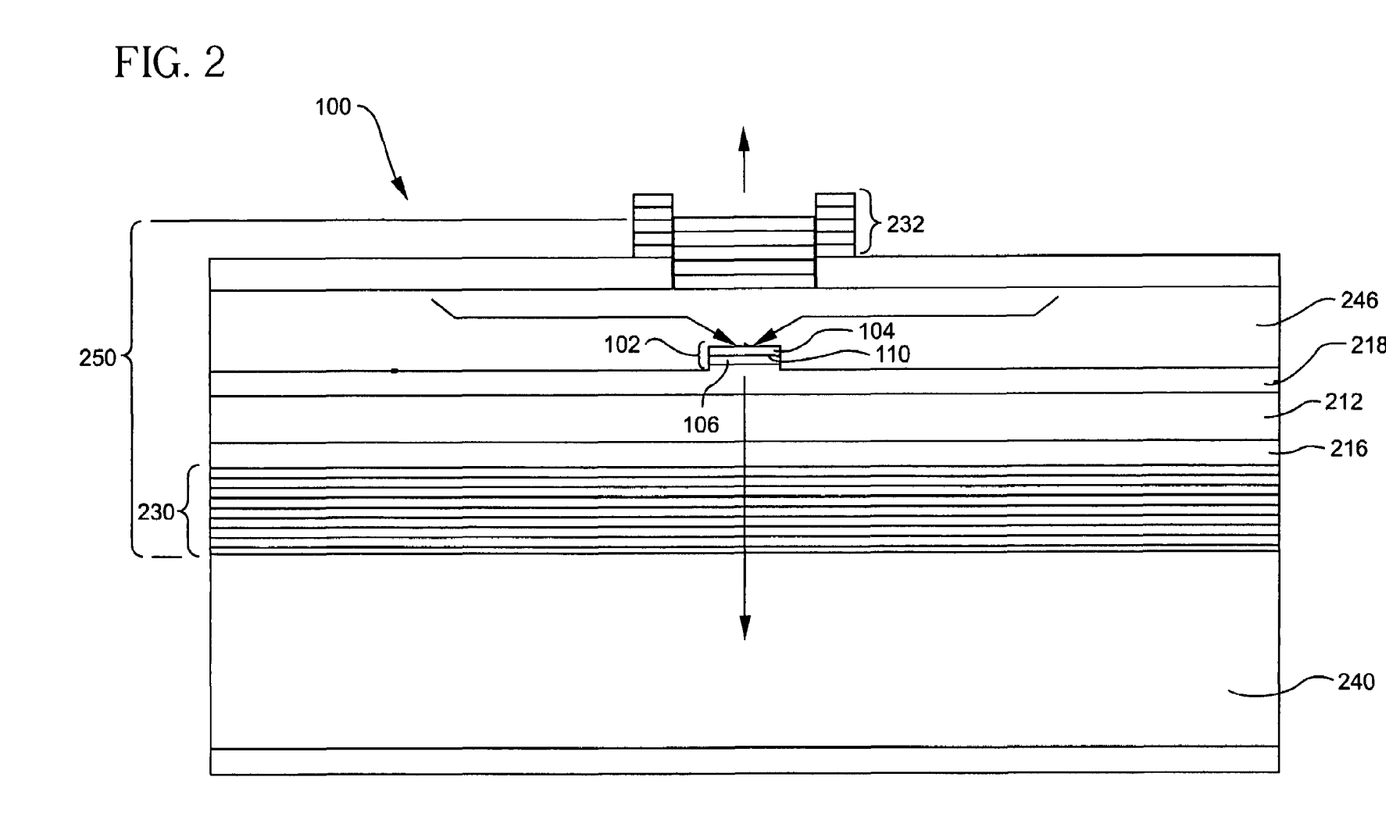
FIG. 2 is a schematic side view of a vertical cavity surface emitting laser, incorporating the tunnel junction structure of FIG. 1, in one embodiment of the present invention.

Referring to FIG. 2, the semiconductor device 100 of FIG. 1 is shown with more detail as a light-emitting device, with the tunnel junction structure 102 of FIG. 1 incorporated. An InP substrate 240 has an upper side and a lower side opposite the upper side, and being characterized by a substrate bandgap and a substrate lattice constant. Because the tunnel layers 104 and 106 are grown sufficiently thin, at least one of the tunnel layers can have a strain matched within +/−2% of the substrate lattice constant.

It will be appreciated that the InP substrate 240, can optionally be removed, after crystal growth. However, because the InP substrate is needed for crystal growth, the tunnel junction still needs to satisfy the lattice match condition. A first interference reflector 230, such as a distributed Bragg reflector (DBR) consisting of a GaAs/AlAs mirror, can be deposited or bonded to the InP based tunnel junction 102 and an active region 212 after removal of the InP substrate 240.

The active region 212 is grown over the upper side of the InP substrate 240. The active region 212 has an effective bandgap configured to generate light at a lasing wavelength in response to injected charge from the tunnel junction structure 102. By design, the active region 212 is structured to generate light having a wavelength between 1000 nm and 1650 nm.

The first interference reflector 230, which strongly reflects light at the lasing wavelength, is disposed near the InP substrate 240 and remote from the tunnel junction structure 102. A second interference reflector 232 is disposed remote from the first interference reflector 230 and near the tunnel junction structure 102. The second interference reflector 232 substantially reflects light at the lasing wavelength generated by the active region 212 disposed between the first and second interference reflectors 230 and 232.

An optical distance between the opposed ends of the first and second interference reflectors 230 and 232 being in a predetermined relationship with the lasing wavelength forms a vertical optical cavity 250 for a vertical cavity surface emitting laser (VCSEL). To provide the required optical distance, one or more spacers are disposed between the first and second interference reflectors 230 and 232. For example, a substrate-side spacer layer 216 and a remote-side spacer layer 218 sandwiches the active region 212 while a tunnel junction spacer layer 246 surrounds the tunnel junction structure 102. By design, the optical cavity 250 is now resonant at the lasing wavelength of the light generated in the active region 212.

Preferably, the tunnel junction structure 102 is epitaxially grown in an OMCVD chamber with a temperature setting in a range about 400–700 degree C. Epitaxially grown between the n-type tunnel junction layer 104 and the active region 212, the first semiconductor material of the first tunnel junction layer is doped with a carbon concentration in a range from about $1.5 \times 10^{19}$ cm$^{-3}$ to $3 \times 10^{20}$ cm$^{-3}$ to form the p-type tunnel junction layer 106.

Similarly grown, the second semiconductor material is doped with a silicon (Si) concentration in a range from about $1.5 \times 10^{19}$ cm$^{-3}$ to $5 \times 10^{19}$ cm$^{-3}$ to provide an n- type tunnel junction layer 104. However, other n-type dopants, such as Sn, can be used.

Figure 3A:
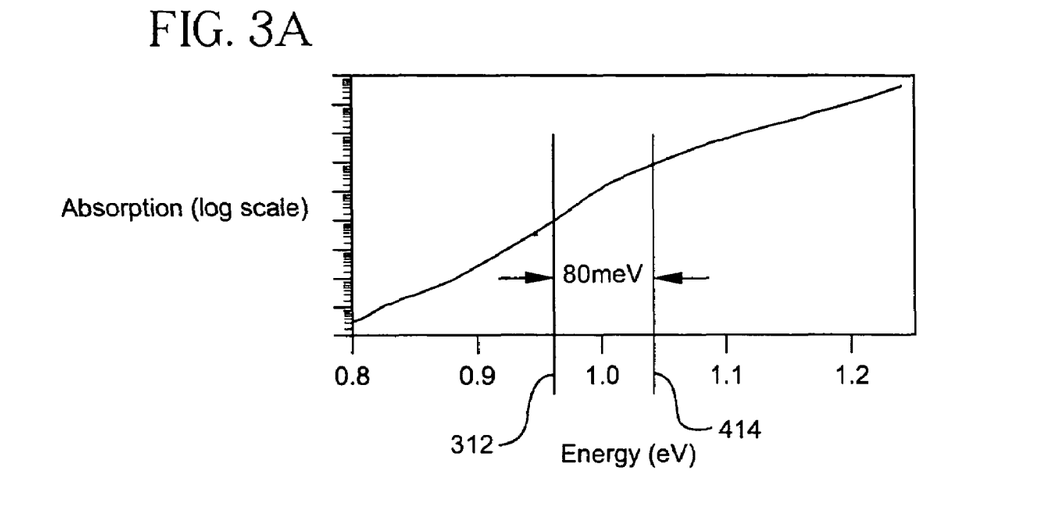
FIG. 3A is a graph of absorption vs energy for a bulk p-doped AlGaAsSb layer 106 on an InP substrate 240 of FIG. 2, according to the present invention.
Figure 3B:
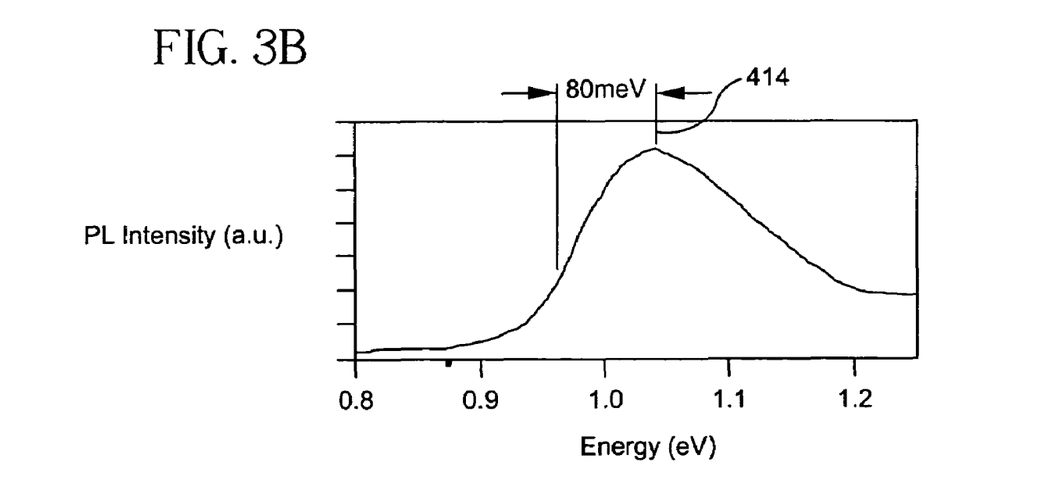
FIG. 3B is a graph of photoluminescence (PL) intensity vs energy for a bulk p-doped AlGaAsSb layer 106 on an InP substrate 240 of FIG. 2, according to the present invention.

Referring to FIGS. 3A and 3B, the graphs of absorption vs energy and photoluminescence (PL) intensity vs energy are shown respectively, for a bulk p-doped AlGaAsSb layer 106 on an InP substrate 240 of FIG. 2. In accordance with the invention, the p-type tunnel junction layer 104 is designed to have an effective bandgap 414 greater than the energy of the lasing wavelength at room temperature 312 by at least 80 milli electron Volts (meV).

The energy at which the PL peak occurs corresponds approximately to the effective bandgap 414 of the material. As can be seen from FIG. 3A, the absorption at this energy is high. From FIG. 3A, it can be seen that the absorption decreases by about two orders of magnitude at an energy which is 80 meV below the PL peak energy. In order to minimize the absorption of the laser light, one needs to choose the composition of the p-doped AlGaAsSb layer 106 to be such that the PL peak energy of this material (which is roughly the effective bandgap energy) to be 80 meV above the photon energy of the lasing wavelength 312. This 80 meV separation is needed between the effective bandgap 414 of the tunnel junction layers and the photon energy of the lasing wavelength 312, and not between the intrinsic bandgap of the tunnel junction layers and photon energy of the lasing wavelength. Determining the optimum bandgap value, ahead of time saves fabrication resources and time. Hence, the effective bandgap of the carbon doped AlGaAsSb p-tunnel junction layer 106 (and the n-doped tunnel junction layer 104) should each satisfy the following equation where the effective bandgap 414 is related to the photon energy of the lasing wavelength 312:

Effective Bandgap(meV)≧Energy of Lasing wavelength at room temperature(meV)+80 meV (Eq. 1)

Using Eq. 1, the effective bandgap 414 of the n-type tunnel junction layer is also related to the photon energy of the lasing wavelength 312. In accordance with the teachings of the present invention, it is actually better to use the same equation for the n-type layer as for the p-type layer. This allows one to use a material with a smaller intrinsic bandgap, which would be better for increasing the probability of tunneling to enhance tunnel junction performance. In the case of n-type layers, the effective bandgap is larger than the intrinsic bandgap, as can be seen in FIG. 4B.

Figure 4A:
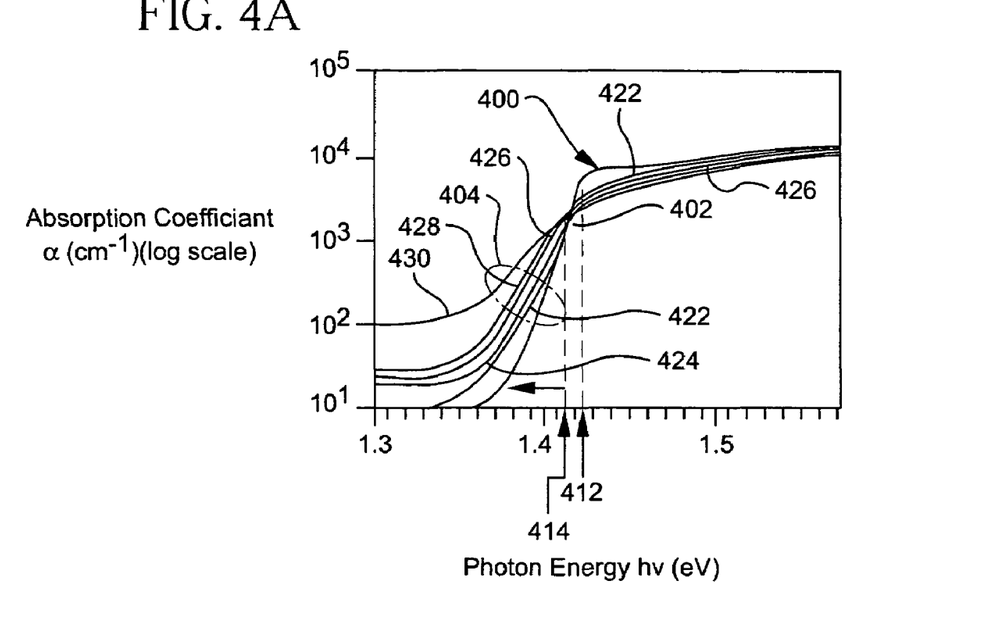
FIG. 4A is a graph of the absorption vs energy in a p-doped GaAs layer.
Figure 4B:
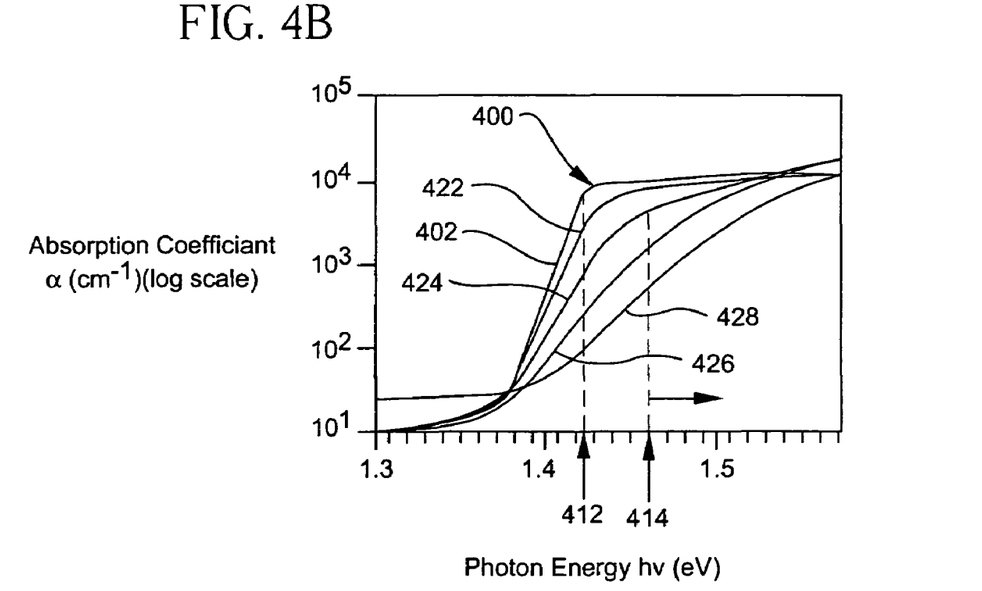
FIG. 4B is a graph of the absorption vs energy in an n-doped GaAs layer.

Referring to FIGS. 4A and 4B, the absorption vs energy in p- and n-doped GaAs are graphed, respectively. Graphs for AlGaAsSb p-type tunnel junction layer 106 and AlGaInAs n-type tunnel junction layer would be similar except that the curves would be shifted to lower energy values. Even though GaAs is shown instead of AlGaAsSb the same tendency between the curves for the p-layer and n-layer is present.

The progression of the curves numbering increases as the dopant concentration increases. For example curve 400 represents the case for a high purity GaAs sample as the starting reference in both the p-type doping graph of FIG. 4A where the free hole concentration is about $1.6 \times 10^{16}$ cm$^{-3}$ and the n-type doping graph of 4B where the free electron concentration is about $5 \times 10^{13}$ cm$^{-3}$. Increasing in dopant concentrations, curves 422, respectively, represent the next higher concentration in both the p-type doping graph of FIG. 4A, where the free hole concentration is about $2.2 \times 10^{17}$ cm$^3$, and the n-doping graph of 4B, where the free electron concentration is about $5.9 \times 10^{17}$ cm$^3$. The progression of curves continue in a similar series with the next curves 424, 426, 428, and 430 (only seen in FIG. 4A).

From comparing the graphs, the absorption edge 402 of the p-type layer tends to shift to smaller energies as the p-dopant concentration increases, as seen in the progression of the curves numbering increasing as the dopant concentration increases.

On the other hand, the absorption edge 402 of the n-type layer shifts to higher energies as seen in the progression of the curves numbering increasing as the dopant concentration increases. Thus, the effective bandgap 414 is seen to be larger than the intrinsic bandgap 412 due to the Moss-Burstein effect in n-type semiconductors. Thus, it is not a problem to design the bandgap of n-type tunnel junction layer 104 using the value of the intrinsic bandgap which is described in the Agilent patent application U.S. 2004/0051113.

In paragraph 52 of the Agilent patent application U.S. 2004/0051113, the intrinsic bandgap of the n-type layer is taught to be different from the p-type material which has a sufficiently high intrinsic bandgap to avoid absorption of the light generated in the active region. The bandgap of each n and p layer should be as low as possible to increase the probability of tunneling and make a better tunnel junction. Furthermore, the Agilent patent application U.S. 2004/0051113 teaches that the energy difference between the valence band energy of the material of the p-type tunnel junction layer and the conduction band energy of the material of the n-type tunnel junction layer should also be small.

If the n-type layer which has the same intrinsic bandgap as the photon energy of lasing wavelength is used, the effective bandgap 414 of this layer (which is much higher than the intrinsic bandgap 412) most likely already satisfies Eq. 1. Other companies have already demonstrated a VCSEL with a tunnel junction which has a narrower intrinsic bandgap n-type layer than the photon energy of the lasing wavelength.

However, the p-type junction layer 106 has a problem, if designed according to the Agilent patent application U.S. 2004/0051113. That is why an 80 meV separation between the effective bandgap and the photon energy of the lasing wavelength is suggested for p-type materials. In accordance with teachings of the present invention, the doping of the first semiconductor material having an intrinsic bandgap to form the p- type tunnel junction layer with the carbon concentration is so high that undesirable bandtails are formed which in effect decreases the intrinsic bandgap 412 of the p-type layer to the effective bandgap 414.

The bandtails (causing the effects 404) effectively decrease the bandgap 414 of the p-layer from its undoped or intrinsic value 412—that is why it has an effective bandgap 414, which is different from the real (or intrinsic) bandgap 412. A larger intrinsic bandgap is needed as the doping increases in the p-type layer because the bandtail (causing the effects 404) increases and reduces the effective bandgap 414.

Absorption by the tunnel junction layers 104 and 106 is further minimized by placing them at a null in the standing wave pattern formed by the laser light within the VCSEL.

An aluminum fraction significantly greater than that at which light absorption is prevented should be avoided to maintain the desirable small difference between the valence band energy of the material of the p-type tunnel junction layer and the conduction band energy of the material of the n-type tunnel junction layer, and also to maintain as small a bandgap as possible.

According to the teachings of the present invention, the bandgap is varied independent of the strain to offer more flexibility to overcome the undesired absorption in the tunnel junction layers. The strain and bandgap can be decoupled, according to the teachings of the present invention. The reason the first semiconductor material includes aluminum (Al) in the p-type tunnel junction layer is for decoupling the lattice strain from the bandgap by maintaining the lattice constant of the p-type tunnel junction layer 106 and allowing the effective bandgap of the p-type tunnel junction layer 106 of the tunnel junction structure 102 to be higher than the photon energy of the lasing wavelength to avoid absorption.

Including Al in the p-type tunnel junction layer does not influence the n-type layer of the tunnel junction. Also, including the Al maintains the lattice constant of the p-type tunnel junction layer and allows one to adjust the strain in the p-type tunnel junction layer while maintaining the bandgap. The strain can be up to 2% in the 30 nm p-tunnel junction layer (similarly for the n-tunnel junction layer) without introducing dislocations in the strained layer.

By adding Al, the same lattice constant can be maintained, but the bandgap can increase. When one changes the As/Sb ratio in GaAsSb the bandgap changes and since the lattice constant changes, so does the strain. When one changes the Al/Ga ratio in AlGaAsSb (or in AlGaInAs, AlGaAs, etc) the lattice constant is nearly constant, only the bandgap changes.

In accordance with the invention, the wavelength at which absorption occurs in the p-type AlGaAsSb layer is thus decreased in order to compensate for the effect of the undesirable bandtails. The decreasing step includes adjusting the composition of the p-type AlGaAsSb layer by suitably adjusting the Al/Ga and As/Sb ratios in order to obtain a low enough absorption such that the p-type AlGaAsSb layer has the effective bandgap greater than the photon energy of the lasing wavelength at room temperature by at least 80 milli electron Volts. Only the Al/Ga ratio is adjusted if the strain is to be kept constant.

Experimentally, one adjusts the As/Sb ratio at a given doping level to control the strain and the Al/Ga ratio to control the effective bandgap (80 meV above or equal to the photon energy of the lasing wavelength). Calculations of the strain change seem to suggest that the strain change with doping up to $5 \times 10^{19}$ cm$^{-3}$ is very small and can be neglected. In any case, the introduction of the dopant gas (CBr4 or CCl4) changes the growth chemistry and introduces a change in the As/Sb ratio (and possibly Al/Ga ratio), which changes the strain, and because the effective bandgap changes with doping, it is difficult to determine what the composition of the AlGaAsSb is but it can be adjusted to obtain the desired effective bandgap and strain.

In order to maintain the strain between $In_xGa_yAl_{(1-x-y)}As$ and InP at +/−2%, x should satisfy $0.83 \geq x \geq 0.24$, with the value of y adjusted to achieve the desired bandgap. The semiconductor material of the n-type tunnel junction layer 104 consists essentially of Indium Gallium Aluminum Arsenide ($In_xGa_yAl_{(1-x-y)}As$), in which $0.83 \geq x \geq 0.24$ and $y \geq 0$, according to the teachings of the present invention for the optimum selection of material systems. With such a material composition for the n-type tunnel junction layer 104, the semiconductor material of the p-type tunnel junction layer 106 consists essentially of aluminum gallium arsenide antimonide $Al_yGa_{(1-y)}As_{(1-x)}Sb_x$, in which $0.752 \geq x \geq 0.22$, and $y \geq 0$.

Alternatively, regardless of the composition of the n-type tunnel junction layer 104, the semiconductor material of the p-type tunnel junction layer consists essentially of aluminum gallium arsenide antimonide $Al_yGa_{(1-y)}As_{(1-x)}Sb_x$, in which $0.752 \geq x \geq 0.22$, and $y \geq 0$.

If the semiconductor material of the n-type tunnel junction layer 104 consists essentially of Indium Gallium Arsenide Phosphide $In_yGa_{(1-y)}As_{(1-x)}P_x$, in which $1 \geq x \geq 0$ and $1 \geq y \geq 0.24$, then the semiconductor material of the p-type tunnel junction layer consisting essentially of aluminum gallium arsenide antimonide $Al_yGa_{(1-y)}As_{(1-x)}Sb_x$, in which $0.752 \geq x \geq 0.22$, and $y \geq 0$ will be used as the carbon doped p-type material for the tunnel junction.

If the $In_yGa_{(1-y)}As_{(1-x)}P_x$ is lattice matched to InP then $$y = (0.2154 + 0.2021x)/(0.4051 + 0.0125x) \quad \text{(Eq. 2.)}$$

However, the $In_yGa_{(1-y)}As_{(1-x)}P_x$ layer can be designed to have a strain of +/−2%. AlGaAsSb is the preferred p-type tunnel junction layer, since we have found that hydrogen compensation of carbon acceptors is significantly less than in materials such as AlGaInAs, which is commonly used for forming the tunnel junction.

EXAMPLE

The invention will be further clarified by the following example.

Example 1

The band gap of the p-type AlGaAsSb tunnel junction layer 106 can thus be adjusted to a suitable value by adjusting the Al/Ga ratio. The p-type AlGaAsSb layer 106 and the AlGaInAs layer 104 layers may be strained. For 1.3 micron VCSELs the effective bandgap wavelengths of AlGaAsSb and AlGaInAs are selected to be 1.2 microns but other suitable values may also be used, as long as Eq. 1 is satisfied. C-doped AlGaAsSb is grown by OMCVD using suitable precursors such as trimethylaluminum, triethylgallium, arsine, trimethylantimony and carbon tetrabromide. However, any other growth method could be used. Hole concentrations of $\sim 3 \times 10^{20}$ cm$^{-3}$ have been achieved in AlGaAsSb. The carrier gas was hydrogen and the growth temperature was $\sim 550°$ C. A higher growth temperature is preferred in order to minimize hydrogen compensation of the C acceptors. The reagents were trimethylaluminum, triethylgallium, trimethylindium, arsine, phosphine, trimethylantimony, disilane and carbon tetrabromide. The reagent flows were adjusted to achieve an effective bandgap wavelength of 1.2 microns for both AlGaAsSb and AlGaInAs, while achieving lattice matching to an InP substrate. The p-doping was done using carbon tetrabromide. The n-doping was done using disilane.

It will be apparent to those skilled in the art that various modifications and variations can be made to the present invention without departing from the spirit and scope of the invention. Thus it is intended that the present invention cover the modifications and variations of this invention provided they come within the scope of the appended claims and their equivalents.

What is claimed is:

1. A tunnel junction device with minimal hydrogen passivation of acceptors, comprising:
    a p-type tunnel junction layer of a first semiconductor material doped with carbon, wherein the first semiconductor material includes aluminum (Al), gallium (Ga), arsenic (As) and antimony (Sb); and
    an n-type tunnel junction layer of a second semiconductor material, wherein the second semiconductor material includes indium (In), gallium (Ga), arsenic (As) and one of aluminum (Al) and phosphorous (P); and
    a tunnel junction between the tunnel junction layers.

2. The device of claim 1, in which: the semiconductor material of the p-type tunnel junction layer consists essentially of aluminum gallium arsenide antimonide $Al_yGa_{(1-y)}As_{(1-x)}Sb_x$, in which $0.752 \geq x \geq 0.22$, and $y \geq 0$.

3. The device of claim 1, structured to generate light having a wavelength between 1000 nm and 1650 nm.

4. The device of claim 1, wherein at least one of the tunnel junction layers has a thickness $\geq 30$ nm.

5. The device of claim 1, wherein each of the tunnel junction layers has a thickness $\geq 30$ nm.

6. The device of claim 1, in which: the semiconductor material of the n-type tunnel junction layer consists essentially of Indium Gallium Aluminum Arsenide $In_xGa_yAl_{(1-x-y)}As$, in which $0.83 \geq x \geq 0.24$ and $y \geq 0$.

7. The device of claim 6, in which: the semiconductor material of the p-type tunnel junction layer consists essentially of aluminum gallium arsenide antimonide $Al_yGa_{(1-y)}As_{(1-x)}Sb_x$, in which $0.752 \geq x \geq 0.22$, and $y \geq 0$.

8. The device of claim 1, in which: the semiconductor material of the n-type tunnel junction layer consists essentially of Indium Gallium Arsenide Phosphide $In_yGa_{(1-y)}As_{(1-x)}P_x$, in which $1 \geq x \geq 0$ and $1 \geq y \geq 0.24$.

9. The device of claim 8, in which: the semiconductor material of the p-type tunnel junction layer consists essentially of aluminum gallium arsenide antimonide $Al_yGa_{(1-y)}As_{(1-x)}Sb_x$, in which $0.752 \geq x \geq 0.22$, and $y \geq 0$.

10. A light-emitting device, comprising:
    an InP substrate for starting epitaxial growth, the substrate having an upper side, and a lower side opposite the upper side, and being characterized by a substrate bandgap and a substrate lattice constant;
    an active region grown over the upper side of the InP substrate, the active region having an effective bandgap configured to generate light at a lasing wavelength in response to injected charge; and
    a tunnel junction structure with minimal hydrogen passivation of acceptors, the tunnel junction structure located to inject charge into the active region and including
        a p-type tunnel junction layer of a first semiconductor material doped with carbon, wherein the first semiconductor material includes aluminum (Al), gallium (Ga), arsenic (As) and antimony (Sb), the p-type tunnel junction layer having an effective bandgap greater than the energy of the lasing wavelength at room temperature by at least 80 milli electron Volts; and
        an n-type tunnel junction layer of a second semiconductor material, wherein the second semiconductor material includes indium (In), gallium (Ga), arsenic (As) and one of aluminum (Al) and phosphorous (P); and
        a tunnel junction between the tunnel junction layers.

11. The device of claim 10, wherein the first semiconductor material includes aluminum (Al) in the p-type tunnel junction layer for decoupling the lattice strain from the bandgap by maintaining the lattice constant of the p-type tunnel junction layer and allowing the effective bandgap of the p-type tunnel junction layer of the tunnel junction structure to be higher than the photon energy of the lasing wavelength to avoid absorption.

12. The device of claim 10 further comprising:
    a first interference reflector disposed near the InP substrate and remote from the tunnel junction structure;
    a second interference reflector disposed remote from the first interference reflector and near the tunnel junction structure, the second interference reflector substantially reflecting light at the lasing wavelength generated by the active region disposed between the first and second interference reflectors; and
    an optical distance between the first and second interference reflectors being in a predetermined relationship with the lasing wavelength for forming a vertical optical cavity for a vertical cavity surface emitting laser (VCSEL).

13. The device of claim 10, in which the p- type tunnel junction layer doped with a carbon concentration in a range from about $1.5 \times 10^{19}$ cm$^{-3}$ to $3 \times 10^{20}$ cm$^{-3}$ is located between the n-type tunnel junction layer and the active region.

* * * * *